(12) United States Patent
Marathe et al.

(10) Patent No.: US 7,379,924 B1
(45) Date of Patent: May 27, 2008

(54) QUANTIFYING AND PREDICTING THE IMPACT OF LINE EDGE ROUGHNESS ON DEVICE RELIABILITY AND PERFORMANCE

(75) Inventors: Amit P. Marathe, Sunnyvale, CA (US); Calvin T. Gabriel, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 321 days.

(21) Appl. No.: 11/001,151

(22) Filed: Dec. 1, 2004

(51) Int. Cl.
*G06F 15/18* (2006.01)
*G05B 13/00* (2006.01)

(52) U.S. Cl. .............................. 706/12; 706/21; 706/15

(58) Field of Classification Search .................. 706/12, 706/15, 21
See application file for complete search history.

(56) References Cited

U.S. PATENT DOCUMENTS

| | | | | |
|---|---|---|---|---|
| 5,548,224 | A * | 8/1996 | Gabriel et al. | 324/765 |
| 5,638,006 | A * | 6/1997 | Nariani et al. | 324/765 |
| 6,028,994 | A * | 2/2000 | Peng et al. | 703/15 |
| 6,583,641 | B2 * | 6/2003 | Wang et al. | 324/765 |
| 6,687,648 | B1 * | 2/2004 | Kumar et al. | 702/181 |
| 6,704,691 | B2 * | 3/2004 | Chiou | 702/188 |
| 6,967,499 | B1 * | 11/2005 | Haase et al. | 324/766 |
| 7,146,588 | B1 * | 12/2006 | Marathe et al. | 716/4 |
| 2002/0158648 | A1 * | 10/2002 | Wang et al. | 324/765 |
| 2003/0237064 | A1 * | 12/2003 | White et al. | 716/5 |
| 2004/0063280 | A1 * | 4/2004 | Miki et al. | 438/257 |
| 2004/0201836 | A1 * | 10/2004 | Chang et al. | 356/237.1 |
| 2004/0253754 | A1 * | 12/2004 | Zhuang et al. | 438/18 |

OTHER PUBLICATIONS

Calvin T. Gabriel, et al., Measuring and Minimizing Line Edge Roughness in BEOL Damascene Dielectric Patterning 2003 AVS 4th International Conference on Microelectronics and Interfaces, Mar. 3-6, 2003, pp. 204-207, Santa Clara, CA USA.

* cited by examiner

*Primary Examiner*—Joseph P. Hirl
*Assistant Examiner*—Adrian L Kennedy
(74) *Attorney, Agent, or Firm*—Amin, Turocy & Calvin, LLP (57) ABSTRACT

Systems and methods are disclosed for testing semiconductors at the wafer level, specifically, systems and methods are disclosed that quantify line-edge roughness in terms of electrical properties and the impact of the line-edge roughness on device reliability and performance. A voltage ramp dielectric breakdown (VRDB) test is used to measure the breakdown voltage of the inter-digitated fingers of a semiconductor device. The distribution of breakdown voltage is used to measure the median breakdown voltage and the outliers which fan the extrinsic tail. Thereby, VRDB is used to quantify the impact LER will have on device reliability and performance. The systems and methods also provide a feedback tool to the fabrication process to control line edge roughness to a desired specification.

9 Claims, 10 Drawing Sheets

QUANTIFYING AND PREDICTING THE IMPACT OF LINE EDGE ROUGHNESS ON DEVICE RELIABILITY AND PERFORMANCE

FIELD OF INVENTION

The present invention relates generally to semiconductor fabrication, and more particularly to systems and methodologies to facilitate predicting, during the wafer manufacturing process, the impact of line edge roughness on device reliability and performance.

BACKGROUND OF THE INVENTION

There has been an increasing demand for semiconductor devices with higher packing densities that are smaller and more precisely formed. Achieving these objectives continues to drive the semiconductor manufacturing industry to improve every aspect of the fabrication process. While there are numerous steps involved with fabricating semiconductors, the steps can be broken down into two major processes. The first major process is the front end of line (FEOL) process which begins with a starting wafer up to the first-metal cut. The second major process is the back end of line (BEOL) process which has been defined as all process steps after the first-metal cut.

Due to high-volume processing of semiconductors and the increased demands of high device reliability and performance, structural defects as well as other undesirable attributes must be constantly monitored and fabrication parameters modified to mitigate the undesirable attributes. Real-time testing and analysis as well as production line control is highly advantageous to prevent scrapping large volumes of production wafers.

During semiconductor fabrication, undesirable structural defects in the dielectric layers, such as line edge roughness (LER) may occur. LER refers to the variations in the sidewalls of features and may originate from LER in a patterned photoresist. LER in photoresists can be caused by various factors such as LER on chrome patterns residing on the reticle, image contrast in a system for generating the photoresist pattern, a plasma etch process which can be used to pattern the photoresist, natural properties and/or weaknesses of the photoresist materials, and the photoresist processing method. In addition, LER appearing in fabricated structures can occur as a result of damage to the patterned photoresist during an etch process.

LER present in the metal lines of the device could negatively impact the BEOL reliability of the device through various factors. First, the effective spacing of the metal lines may be reduced, resulting in an increase in the electrical field for a given voltage difference between the lines. The sharp corners caused by LER may result in a higher local electric field which could be more than two times the nominal field. In addition, LER may increase the total surface area between the lines, increasing the probability of, for example, Cu (copper) diffusion between the lines.

Such wafer defects have prompted wafer fabrication facilities to initiate wide-spread process controls in an attempt to mitigate wafer defects and increase wafer throughput. Currently, wafer fabrication facilities monitor thousands of wafer parameters in order to achieve the above-mentioned goals. Accordingly, control protocols, such as wafer level reliability (WLR) testing, continue to gain popularity as process controls for identifying potential factors that can detrimentally affect device reliability. However, there remains a need in the art for systems and methods that improve efficiency and speed in wafer fabrication while predicting the impact defects may have on device reliability and performance via real-time testing and analysis. There is also an unmet need to communicate, via a feedback method, the wafer reliability information to a fabrication facility and provide for timely and effective parameter adjustments during the fabrication process.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides for systems and methods that facilitate wafer level reliability prediction(s) during wafer fabrication via analyzing and/or adjusting the amount of line edge roughness present on components during the wafer fabrication processes.

According to one aspect of the present invention, a voltage ramp dielectric breakdown (VRDB) test is conducted to determine the reliability of the device. During the VRDB test, an increasing voltage, preferably in steps, is applied to the semiconductor device. The voltage may be increased via a control component. The voltage is increased until the semiconductor device undergoes dielectric breakdown. The voltage at which the semiconductor breaks down is known as the breakdown voltage. The distribution of breakdown voltage is used to measure the median voltage breakdown and to determine the outliers that fan the extrinsic tail.

According to another aspect of the present invention, a wafer-level VRDB test is conducted to quantify the impact of LER on device reliability. The information obtained from the VRDB test is used as a feedback tool to the fabrication process to control LER to a specification determined, for example, by the VRDB test results.

According to yet another aspect of the present invention is a system that facilitates predicting reliability of semiconductor devices comprising a wafer level test component that performs an in line production test on a wafer and a control component that quantifies the impact of line edge roughness. The wafer level test component performs a voltage ramp dielectric breakdown test and can determine a wafer breakdown voltage and distribution. The wafer level test component may also measure a median voltage breakdown. The control component may adjust at least one test voltage to apply a stepped voltage to the wafer. The control component may also provide feedback information to a fabrication facility and adjust fabrication parameters. Also provided is a monitoring component which gleans information regarding at least one physical parameter of the wafer.

Another aspect of the present invention is a system that facilitates predicting reliability of production wafers comprising a means for testing a wafer having line edge roughness using a voltage ramp dielectric breakdown test and a means for quantifying line edge roughness in terms of electrical properties.

An advantage of the present invention is simplification and reduction in the cost of manufacturing by providing real-time feedback information to the fabrication facility regarding the impact structural defects may have on device reliability and performance. In this way, structural defects that adversely affect device reliability may be detected and corrected on a real-time basis which will reduce or eliminate the manufacture of defective or unreliable devices.

Another advantage of the present invention is that accuracy and precision of wafers is improved by employing the various testing and prediction procedures. The present invention also improves reliability and efficiency of both the fabrication process and devices fabricated via in line production testing and information communication with the fabrication facility. The signal to noise ratio of the devices may also be greatly improved according to an aspect of the present invention.

To the accomplishment of the foregoing and related ends, certain illustrative aspects of the invention are described herein in connection with the following description and annexed drawings. There aspects are indicative, however, of but a few of the various ways in which the principles of the invention can be employed and the present invention is intended to include all such aspects and their equivalents. Other aspects, advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout. The present invention will be described with reference to systems and methods for utilizing wafer level electrical test results in order to facilitate predicting the reliability of wafers in a wafer fabrication environment. It should be understood that the description of these exemplary aspects are merely illustrative and that they should not be taken in a limiting sense.

Certain methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

The term "component" refers to a computer-related entity, either hardware, a combination of hardware and software, software, or software in execution. For example, a component can be a process running on a processor, a processor, an object, an executable, a thread of execution, a program or a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function line networks) can be employed.

Figure 1:
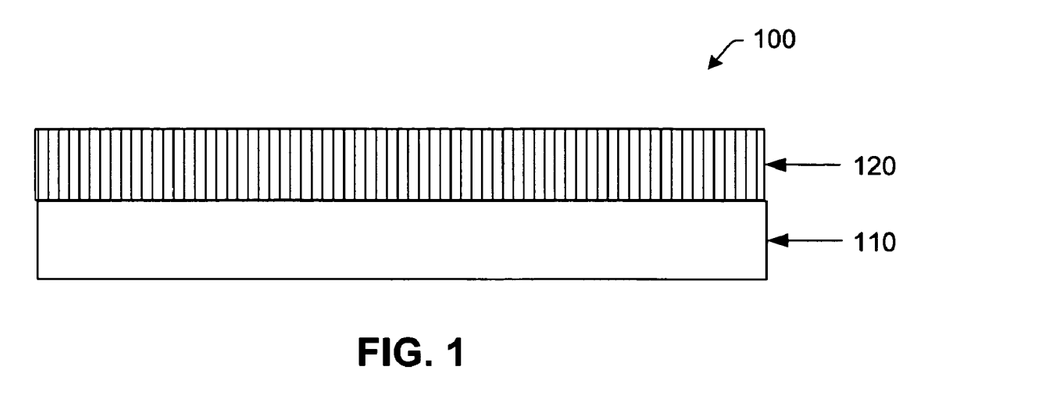
FIG. 1 illustrates an exemplary schematic cross-section of a semiconductor structure according to an aspect of the present invention.

FIG. 1 illustrates a schematic, cross-sectional view of an exemplary wafer 100 undergoing semiconductor processing according to one aspect of the present invention. The wafer 100 includes a semiconductor substrate 110 that can be any substrate used in the course of semiconductor processing or any semiconductor surface. The substrate 110 is formed using methods known to one skilled in the art. Examples of substrate 110 for the present invention include semiconductor materials such as gallium arsenide (GaAs), germanium, silicon, silicon germanium, lithium niobate, and compositions containing silicon such as crystalline silicon, polysilicon, amorphous silicon, epitaxial silicon, silicon dioxide (SiO2), and mixtures thereof. Typically, the substrate 110 is a silicon substrate, optionally with various elements and/or layers there over; including metal layers, barrier layers, dielectric layers, device structures, active elements and passive elements including polysilicon gates, wordlines, source regions, drain regions, bit lines, bases, emitters, collectors, conductive lines, conductive plugs, etc.

A dielectric layer 120 is formed on the substrate 110. Any dielectric material can be used in accordance with the present invention. Both organic and inorganic dielectric materials may be used. Similarly, both low and high k dielectrics may be used. Also, both polymeric, amorphous, crystalline and monomeric materials can be used as dielectric materials. Examples of dielectric materials include silicon containing spin-on glasses such as alkoxysilane polymer, a siloxane polymer, a silsesquioxane polymer, a poly (arylene ether), a fluorinated poly(arylene ether), other polymer dielectrics, nanoporous silica or mixtures thereof. Optionally, prior to formation of dielectric layer 120 one or more layers of insulators, barriers, metal interconnects, and/or passivization layers can be formed on the substrate 110.

Any suitable technique may be used to form the dielectric layer 120. For example, chemical vapor deposition (CVD), plasma enhanced chemical vapor deposition (PECVD), or low pressure chemical vapor deposition (LPCVD), high pressure chemical vapor deposition (HPCVD) methods can be used. Polymeric dielectrics can also be formed by using spin-coating, dip-coating, spraying, or roller coating.

The dielectrics are deposited to a thickness appropriate to facilitate via formation and subsequent fabrication procedures. Typically, dielectrics are deposited to a thickness from about 1000 Å to about 50,000 Å. In one embodiment, the dielectric layer 120 is deposited over substantially the entire surface of the substrate 110. In another embodiment, the dielectric layer 120 is deposited on only part of the surface of the substrate 110. While only one dielectric layer is shown, it should be appreciated that at least one dielectric layer and one or more dielectric layers are contemplated to be within the scope of the present invention. It should also be understand that the term dielectric layer is meant to include the terms interlevel dielectric layer(s) (ILD) and inter metal dielectric layer(s) (IMD).

Figure 2:
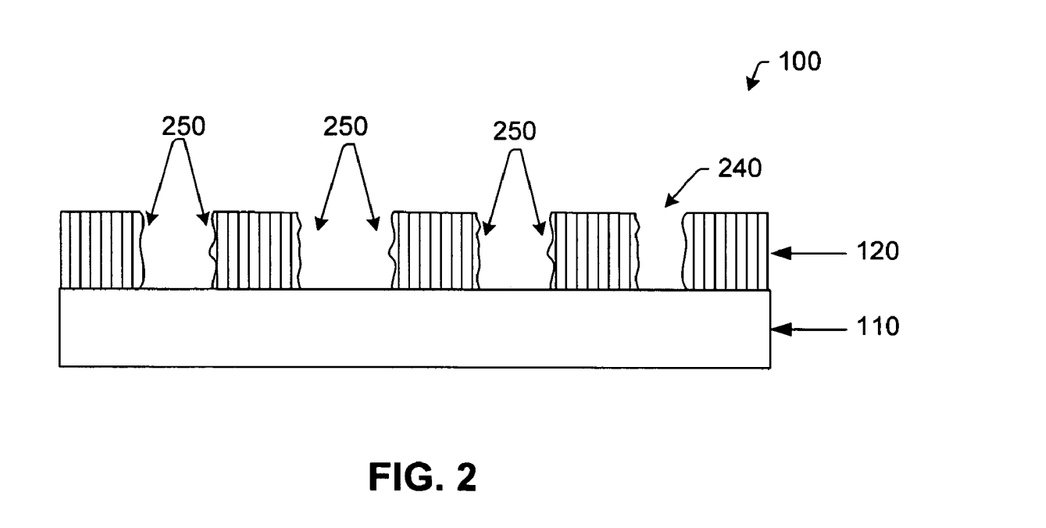
FIG. 2 illustrates a schematic cross-section of a partially fabricated semiconductor device with line-edge roughness according to an aspect of the present invention.

FIG. 2 illustrates an exemplary wafer 100 with an opening 240 formed, such as a trench image, in the dielectric layer 120. The trench image 240 can have relatively vertical sidewalls which extend perpendicular to the topological surface of the dielectric layer 120. However, any trench shape may be used with the present invention. In addition, while only one dielectric layer is shown, it is to be understood that the present invention works well with one dielectric layer or more than one dielectric layer. The sidewalls 250 of the trench images 240 formed in the dielectric layer 120 may exhibit line-edge roughness (LER). While sidewalls 250 of substantially square shape are shown, the trench sidewalls may be any shape and is not limited by the present invention. For example, the sidewalls may form a "V-shaped" trench, or a circular or oval shaped trench, or any other shape desired. LER may be caused by lithographic etch patterning effects and becomes a serious concern as circuits are fabricated with higher device densities through scaled down device dimensions and increased packing densities. If LER is present in interconnect trench sidewalls, the effective spacing between the sidewalls is reduced causing a measurable increased electrical field for a given voltage difference between the lines. In addition, LER causes sharp corners on the trench sidewalls, resulting in a higher local electrical field, which can be measured and quantified. LER also increases the total surface area between the lines, increasing the probability of Cu diffusion between the lines.

Figure 3:
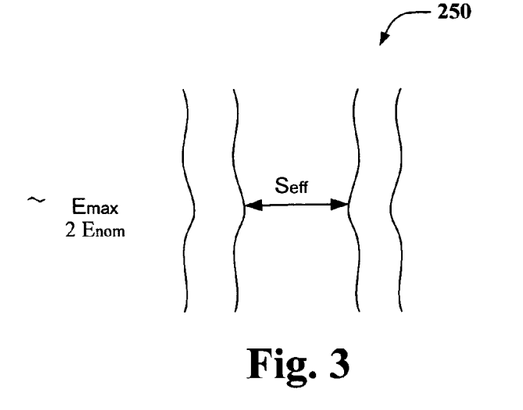
FIG. 3 illustrates metal lines of a wafer, exhibiting line edge roughness according to an aspect of the present invention.

With reference now to FIG. 3, illustrated are sidewall trenches 250 with LER. The presence of LER results in sidewalls 250 having deformities, such as areas of protrusions or projections. The protrusions result in adjacent trench sidewalls 250 being closer at some areas along the sidewall(s) and father away at other areas of the sidewall(s). Overall, the presence of LER reduces the effective spacing ($S_{eff}$) between the metal lines 250. The reduction of $S_{eff}$ is undesirable and can lead to an increase in the electrical field for a given voltage difference between the lines. This increase in the electrical field can be measured via an in-line production test, such as a VRDB test.

LER on trench sidewall(s) may cause areas of projections and areas of indentations or depressions on the sidewalls 250. The indentations and projections may have sharp corners or angles due to the imperfections of the sidewalls. These sharp angles or corners may result in a higher local electrical field. For example, the maximum electrical field ($E_{max}$) could be more than two times the nominal electrical field ($E_{nom}$). The higher maximum electrical field can be measured via various in-line production tests. A higher $E_{max}$ may be an indication that LER is present and may be indicative of poor device reliability and performance. Thus, if a high $E_{max}$ is measured, according to an aspect of the present invention, this information can be feedback to the fabrication process allowing changes in the fabrication process to mitigate the effects of LER.

Figure 4:
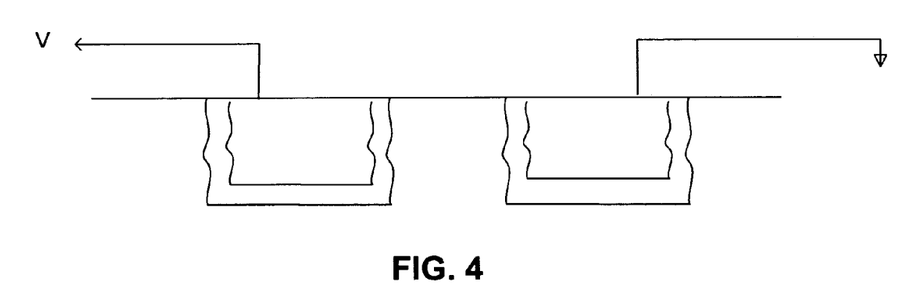
FIG. 4 illustrates a wafer, exhibiting line edge roughness, undergoing an in-line production VRDB test according to an aspect of the present invention.
Figure 5:
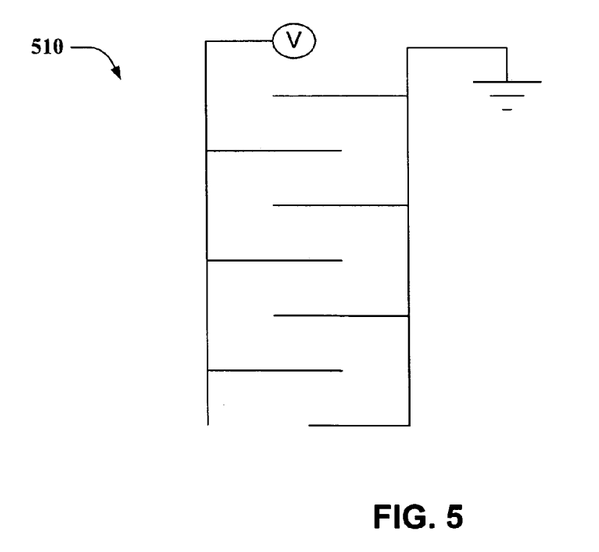
FIG. 5 illustrates the inter-digitated fingers of a wafer undergoing an in-line production test according to an aspect of the present invention.

As shown in FIGS. 4 and 5, a VRDB test is conducted by applying an increasing voltage to the wafer. The voltage is not increased linearly but, preferably is increased in steps. For example, the voltage may be ramped up at a step of 0.2 volts at different intervals of time, such as 25 and 250 milliseconds, until the current reaches, for example, 10 milliamps. The voltage at which the wafer undergoes dielectric breakdown is known as the dielectric breakdown voltage $V_{BD}$ and occurs when the voltage applied to an insulator exceeds certain limits. This voltage level causes the insulator to break down electrically, resulting in losing, or deteriorating, the insulating properties. The $V_{BD}$ is the voltage at which an electrically conductive path is created through a dielectric.

With continuing reference to FIG. 5, illustrated are interdigitated fingers 510 of a semiconductor undergoing a production level test, such as a VRDB test. Once $V_{BD}$ is known, the distribution of breakdown voltage can be determined and used to calculate the median voltage breakdown. It can also be used to identify the outliers, which fan the extrinsic tail. In such a way, the VRDB test can be used to quantify the impact of LER on wafer reliability and performance though variations in the electrical properties of the device due to a reduction in the effective spacing, sharp corners, and an increase in total surface area between the lines. If defects adversely impact device reliability, the information from the VRDB test can be feedback to the fabrication facility allowing for adjustments to be made in fabrication parameters to reduce or eliminate LER, thereby reducing or eliminating its impact on device reliability.

Figure 6:
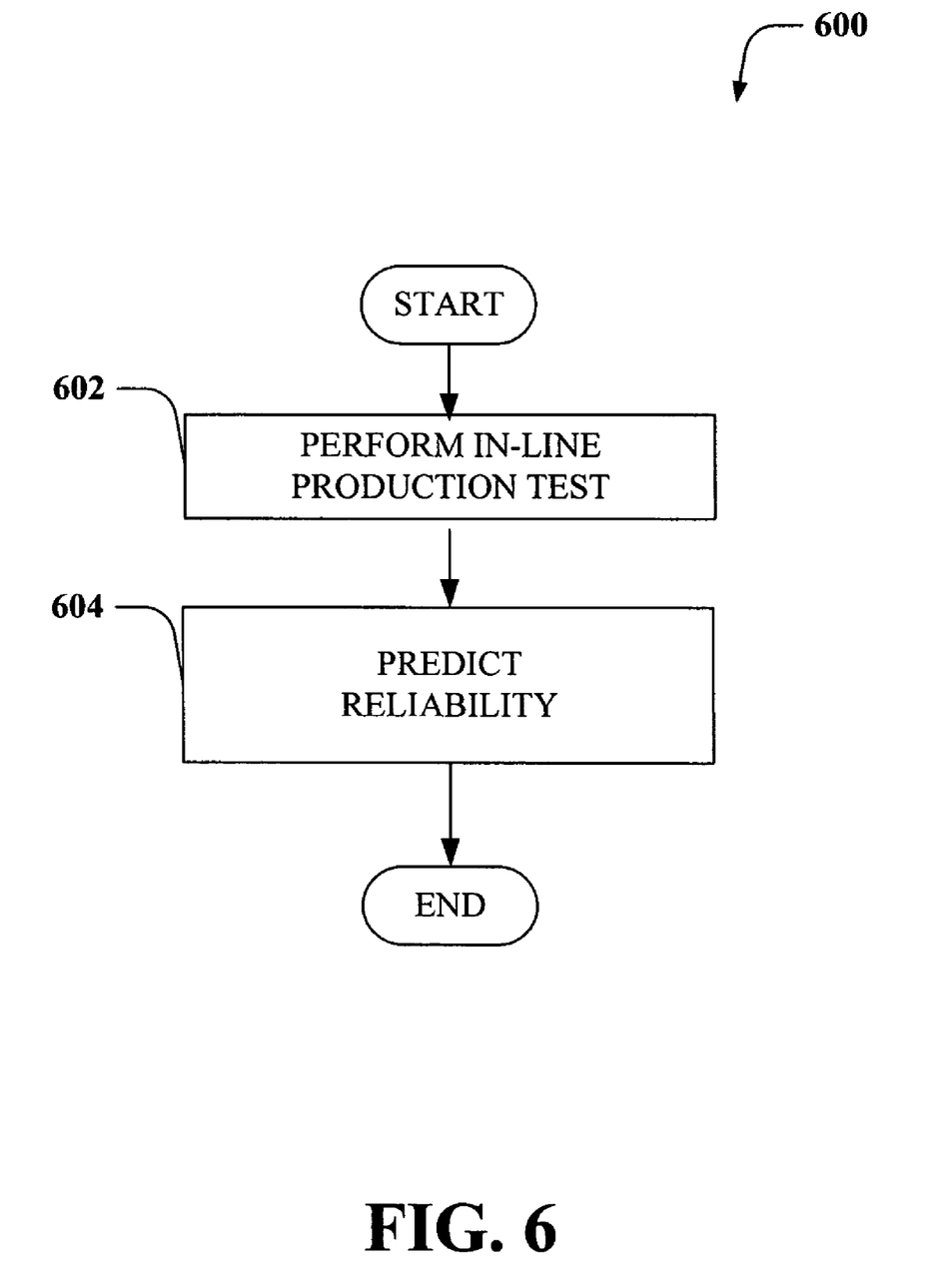
FIG. 6 illustrates a system 600 that facilitates predicting reliability and performance of production wafers according to an aspect of the present invention.

FIG. 6 illustrates a methodology 600 in accordance with an aspect of the present invention. At 602 an in-line production test, such as a voltage ramp dielectric breakdown (VRDB) test, is performed on a production wafer. The VRDB test applies an increasing voltage to a wafer. This voltage is applied, preferably in steps, rather than at a constant rate. The voltage is increased in these steps until the wafer undergoes dielectric breakdown. The voltage at which the wafer breaks down is known as the breakdown voltage ($V_{BD}$). In particular, $V_{BD}$ is the voltage level at which the insulating dielectric begins to allow charge flow. The charge flow is non-linear. For example, below a threshold voltage no charge will flow. At, or above, that threshold voltage, a surge of charge will flow. At the $V_{BD}$ point, the dielectric material properties become unpredictable. $V_{BD}$ is related to dielectric thickness. Thus, protrusions on the sidewall(s) due to structural defects, such as LER, will effect $V_{BD}$. Once $V_{BD}$ is obtained, the distribution of $V_{BD}$ can be used to measure the median $V_{BD}$ and the outliers which fan the extrinsic tail. At 604, the results of the VRDB test are used to quantify the impact of LER of device performance and reliability. These calculations may be performed manually or they may be generated via a computer-related entity or any other means of evaluating and analyzing data.

Knowing the impact that structural defects, such as LER, will have on the reliability and performance of production wafers during the fabrication process is desirable to maintain the quality and consistency of the wafers. Structural defects may cause many reliability issues through various factors. Due to structural defects, such as LER, the effective spacing between the metal lines is reduced which increases the electrical field for a given voltage difference between the lines. In addition, the sharp corners due to LER results in a higher local electrical field. The maximum electrical field could be more than two times the nominal electrical field. Finally, LER increases the total surface area between the lines. This increase in total surface area increases the probability of Cu diffusion between the lines. These various factors may be quantified via electrical testing and comparison. Performing such quantifying and evaluation is important to determine the impact of LER on device reliability and performance and to reduce and eliminate fabrication factors that contribute to the occurrence of structural defects.

Figure 7:
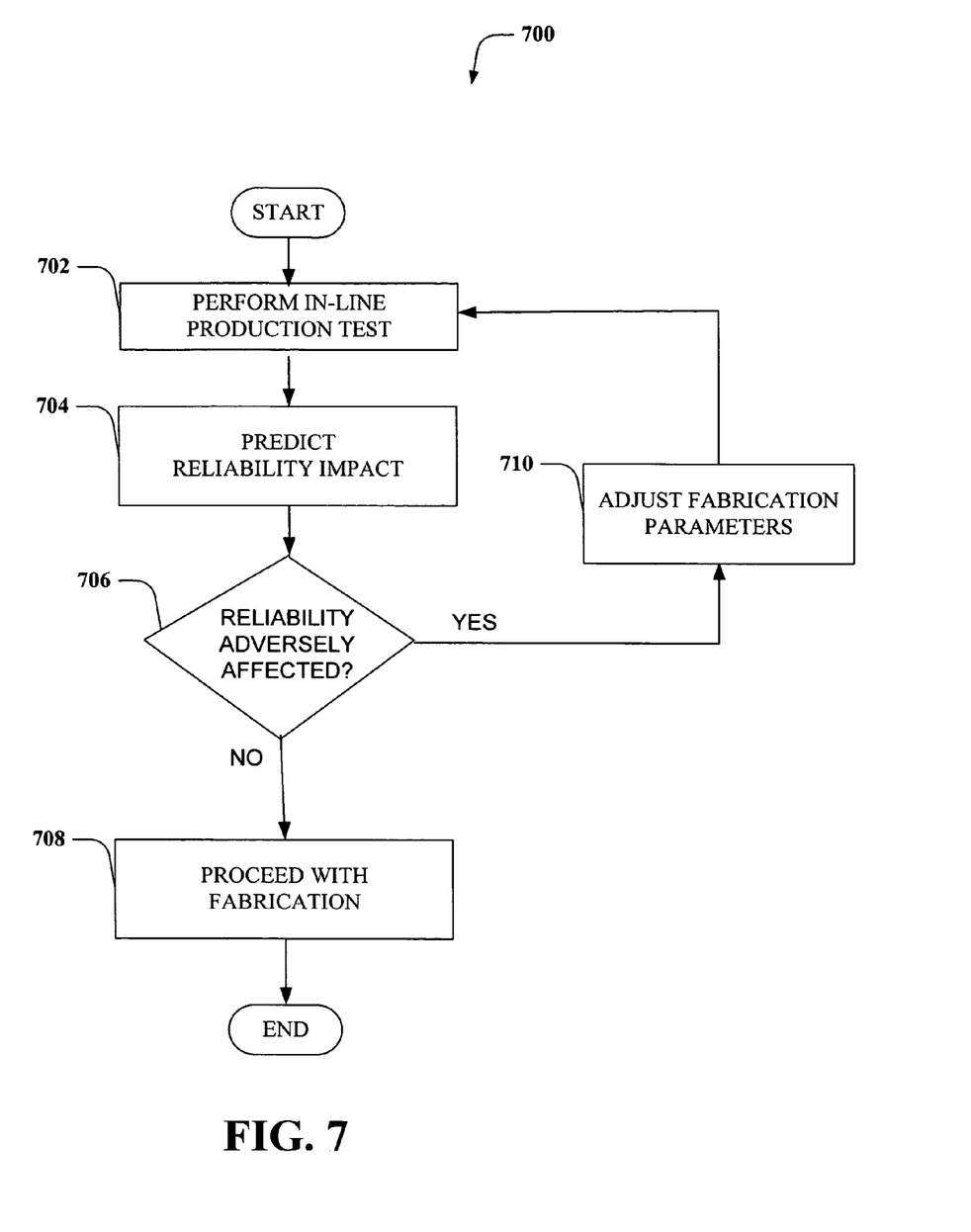
FIG. 7 illustrates a system 700 that facilitates predicting reliability and performance of production wafers when process variations in a wafer fabrication facility is mitigated in accordance with an aspect of the present invention.

FIG. 7 is an illustration of a methodology 700 that facilitates predicting reliability and performance of production wafers when process variations in a wafer fabrication facility is mitigated in accordance with an aspect of the present invention. At 702 an in-line production test is performed. The wafer level test may consist of a VRDB test which quantifies the dielectric breakdown voltage of the interdigitated fingers of a production wafer. The breakdown voltage and various electrical properties of the wafer may be affected due to structural defects including LER. The distribution of the breakdown voltage can be used to measure the median breakdown voltages and the outliers which fan the extrinsic tail. At 704, the information can then be used to quantify and predict the impact that a particular structural defect, such as LER, will have on the reliability and performance of the wafer. Wafer reliability and/or performance can be predicted based on the information obtained from the wafer level reliability testing. At 706 a determination is made whether the reliability of the wafer is adversely affected due to the presence of structural defects. If there is not an adverse impact on device reliability due to structural defects, information does not have to be communicated to the fabrication facility and the fabrication process continues, at 708. However, this information may be communicated to the fabrication facility for monitoring purposes. The information may be recorded, stored, or printed for further reference and evaluation. If it is predicted that reliability is adversely affected due to the structural defects, it is desirable to communicate the information to the fabrication facility, via a feedback mechanism, so parameters in the fabrication facility can be changed to reduce or eliminate the occurrence of structural defects, at 710. Once again, the results of the electrical testing may be recorded, stored, monitored, or otherwise maintained for future reference. The production wafers manufactured with the adjusted parameters would have an in-line test performed beginning at 702. This process would continue with testing and changing parameters in the fabrication facility until reliability of the device is not adversely affected due to the structural defects.

Figure 8:
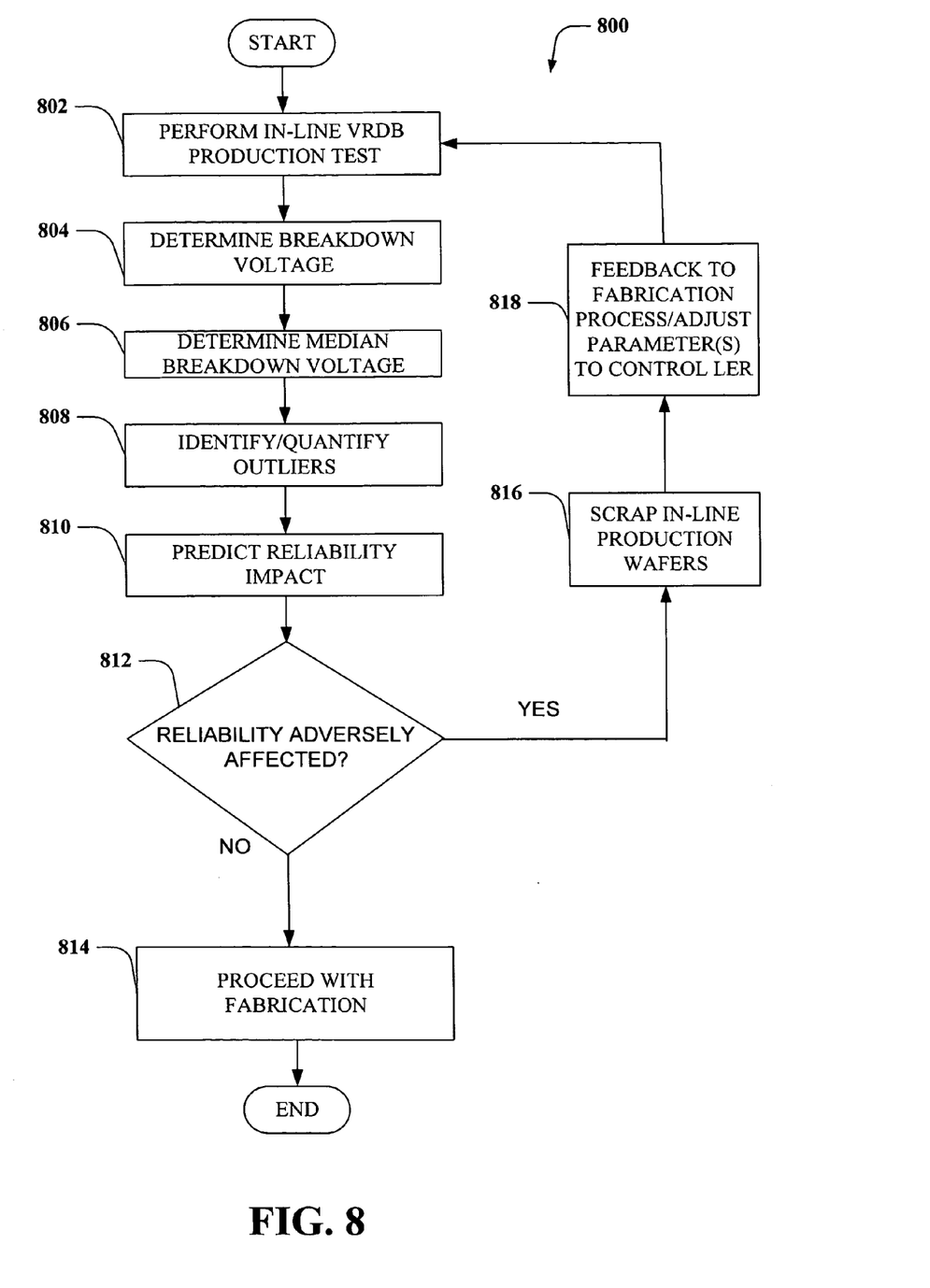
FIG. 8 illustrates a system 800 that facilitates predicting reliability of production wafers when process variations in a wafer fabrication facility is mitigated in accordance with an aspect of the present invention.

FIG. 8 illustrates a system 800 that facilitates predicting reliability of production wafers when process variations in a wafer fabrication facility is mitigated in accordance with an aspect of the present invention. At 802 a VRDB test is performed by subjecting a production wafer to steps of increasing voltage. The $V_{BD}$ of the wafer is determined at 804, which is the point where the dielectric begins to allow charge to flow. At 806, the median $V_{BD}$ of the wafer is determined. The outliers are then identified and/or quantified at 808. A determination is made at 810 whether reliability of the wafer is adversely affected due to structural defects, such as LER, as indicated by $V_{BD}$ measurements and calculations. If the reliability is not adversely affected, the fabrication process continues at 814 with no changes in the fabrication process. If the structural defects will cause reliability to be adversely affected, the information is communicated to the fabrication process at 818 and adjustments are made to the fabrication process to control the structural defects. The subject wafers, as well as other wafers that may be adversely affected by structural defects, may be destroyed, or otherwise disposed of at 816. When new production wafers are fabricated with the adjusted parameters, a VRDB test is performed on the new wafers at 802. The process will continue until it is predicted that the structural defects will not cause the reliability of the wafer to be adversely affected. It is contemplated that the process will be repeated periodically even when test results indicate that reliability is not adversely affected. Periodic testing will catch any changes in the fabrication process due to known, unknown or unforeseen events.

Figure 9:
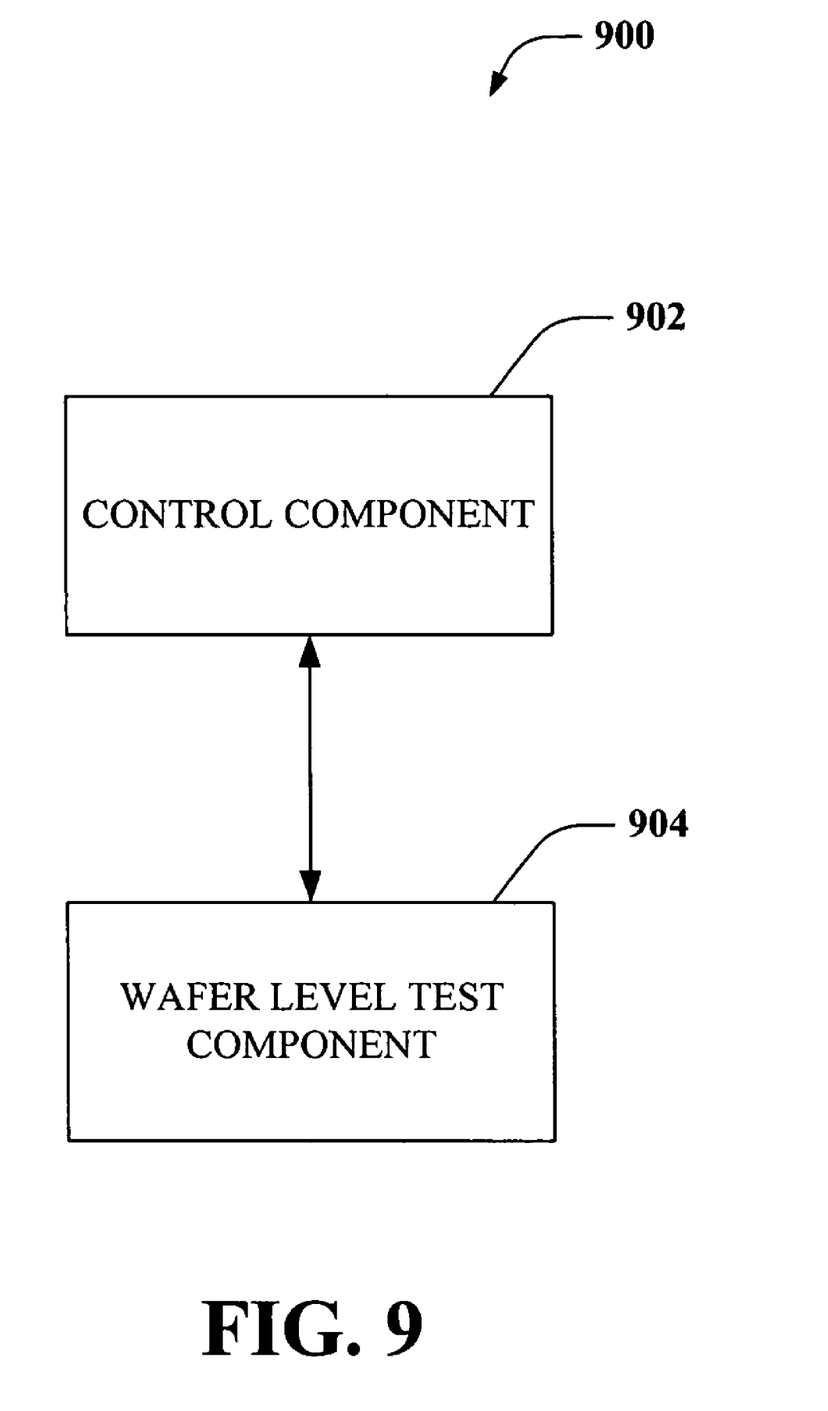
FIG. 9 is an illustration of a system 900 that facilitates predicting reliability and performance of production wafers when process variations in a wafer fabrication facility is mitigated in accordance with an aspect of the present invention.

FIG. 9 is an illustration of a reliability prediction 900 according to an aspect of the present invention, in which a control component 902 is operatively coupled to a wafer level test component 904. The control component 902 can receive information from the wafer level component 904 to quantify the impact of LER and determine the effect of the structure defects on device reliability. The control component 902 can determine an appropriate fabrication parameter adjustment to ensure that structural defects that impact device reliability and performance are mitigated during the fabrication process.

Device reliability and performance can be predicted via, for example, a VRDB test to measure the voltage breakdown of the interdigitated fingers. Next, the distribution of voltage breakdown is used to measure the median voltage breakdown. The distribution of voltage breakdown is also used to quantify the outliers which fan the extrinsic tail. The wafer level test component 904 can perform the reliability test using data from the VRDB test to quantify the impact of structural defects on device reliability. A determination is made, based on the VRDB test whether device reliability is adversely affected due to the structure defects, such as LER.

Upon receiving information indicating that the wafer level test is complete, the control component 902 can communicate the information via, for example a feedback mechanism, to the fabrication process. If device reliability is not adversely affected by the structural defects, the fabrication process may continue with no fabrication parameter changes. The wafer level test may be periodically conducted to ensure that the fabrication parameters remain adequate and structural defects have not been introduced into the fabrication process that will adversely affect device performance.

If the control component 902 receives information from the wafer level test component that indicates the reliability of the wafer is adversely affected due to the structural defects, the control component will send feedback to the fabrication process to adjust parameters to reduce the occurrence of structural defects. The adjustments required may be determined via the control component 902 or they may be determined manually in the fabrication facility. Once adjustments in the fabrication process are made, the control component 902 and the wafer level test component 904 will conduct another test on production wafers fabricated according to the adjusted parameters. In this way, the effect the parameter adjustments will be evaluated to determine if the adjustments mitigated the structural defects and the impact of those structural defects on device reliability and performance. The process will continue until the fabrication parameters are adjusted sufficiently so that any structural defects present will not adversely affect device reliability.

Figure 10:
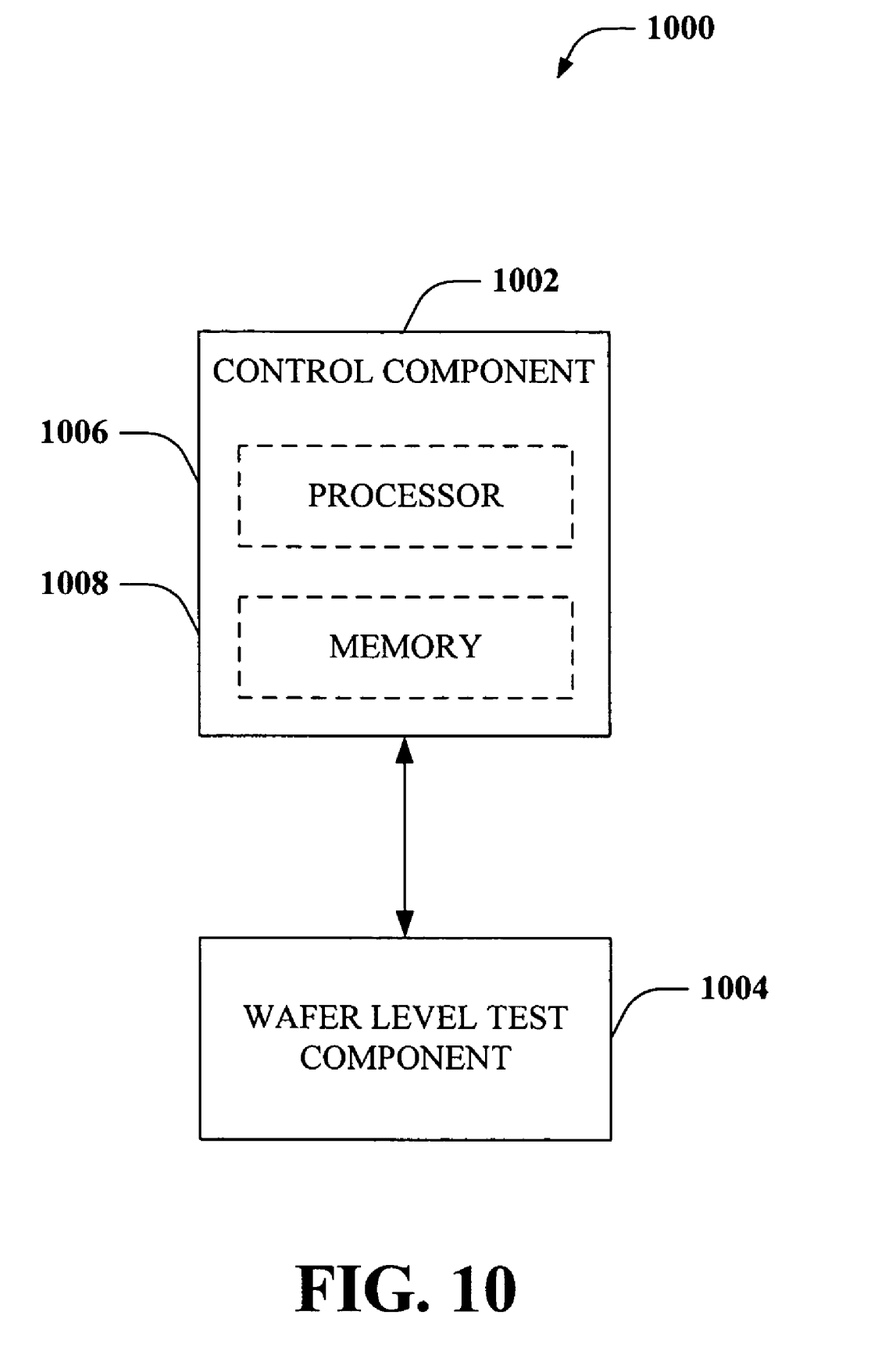
FIG. 10 is an illustration of a system 1000 that facilitates predicting reliability and performance of production wafers when process variations in a wafer fabrication facility is mitigated in accordance with an aspect of the present invention.

FIG. 10 illustrates a reliability prediction system 1000 in accordance with an aspect of the present invention. A control component 1002 is operatively coupled to a wafer level test component 1004. The wafer level test component performs a VRDB test on a production wafer to determine the impact of structure defects on wafer reliability and performance. If the presence of structural defects will adversely affect device performance and reliability, the information is feedback to the production floor to adjust fabrication parameters to reduce or eliminate the presence of structural defects to bring the wafer in accepted tolerances.

Additionally, the control component 1002 comprises a processor 1006 and a memory 1008. It is to be understood that the processor 1006 can be a processor dedicated to predicting reliability and/or to facilitate voltage adjustments, etc., a processor used to control one or more of the components of the reliability prediction system 1000, or alternatively, a processor that is both used to predict reliability and/or facilitate voltage adjustments, etc., and to control one or more of the components of the reliability prediction system 1000.

The memory component 1008 can be employed to retain information associated with, for example, dielectric breakdown voltage, the distribution of $V_{BD}$, the median $V_{BD}$ and the outliers, predicted reliability of a wafer due to structural defects, voltage adjustment for testing wafers, etc. Furthermore, the memory 1008 can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 1008 of the present systems and methods is intended to comprise, without being limited to, these and any other suitable types of memory.

Figure 11:
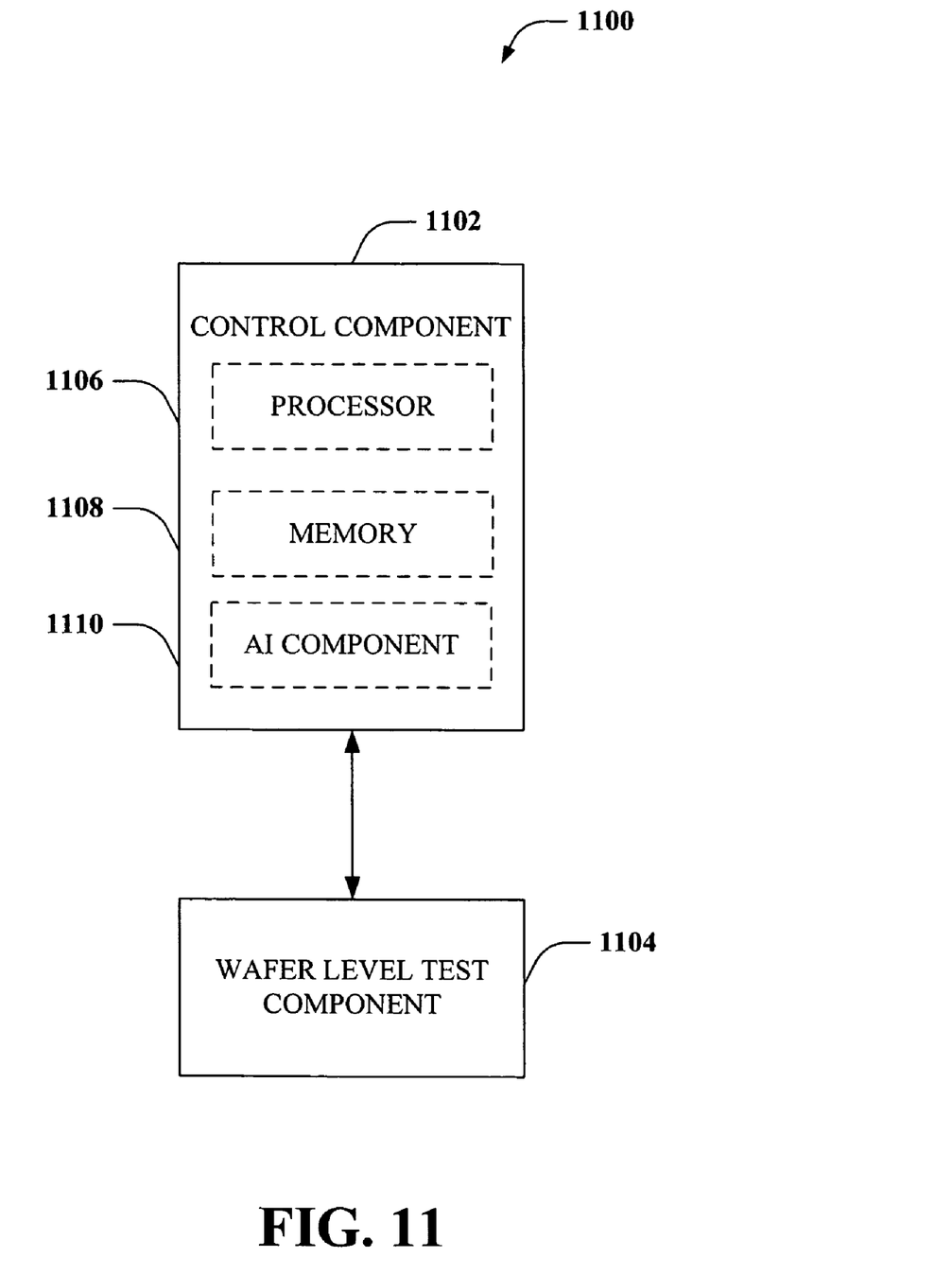
FIG. 11 is an illustration of a system 1100 that facilitates predicting reliability and performance of production wafers when process variations in a wafer fabrication facility is mitigated, comprising an artificial intelligence component in accordance with an aspect of the present invention.

FIG. 11 is an illustration of a system 1100 that facilitates predicting reliability and performance of production wafers when process variations in a wafer fabrication facility is mitigated, comprising an artificial intelligence component in accordance with an aspect of the present invention. The system 1100 can employ various inference schemes and/or techniques in connection with predicting device reliability. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 11, a control component 1102 is operatively connected to a wafer level test component 1104. The wafer level test component 1104 can glean information from a test set of interconnect lines (e.g., copper, aluminum, etc.) in order to provide the control component 1102 with data for determining voltage breakdown to facilitate appropriate voltage adjustments to cause the test voltage to increase in steps, rather than at a constant rate. The control component 1102 comprises a processor 1106, a memory 1108, and an AI component 1110. The AI component 1110 can make inferences regarding, for example, a proper adjustment to voltage level(s) to facilitate achievement of a stepped applied voltage to the test wafer. The AI component 1110 may also make inferences regarding the required adjustments to fabrication parameters to reduce the impact of LER on device performance and reliability.

The control component 1102 can direct the wafer level test component 1104 to perform a VRDB test to determine $V_{BD}$ of the wafer and to predict device performance and reliability. The AI component 1110 can then make further inferences regarding, for example, proper adjustments to voltage level(s) to facilitate achievement of a desired stepped voltage applied to a production wafer. The AI component 1110 or the control component 1102 may also predict fabrication parameter adjustments to reduce the presence of structural defects, such as LER, on the device.

Figure 12:
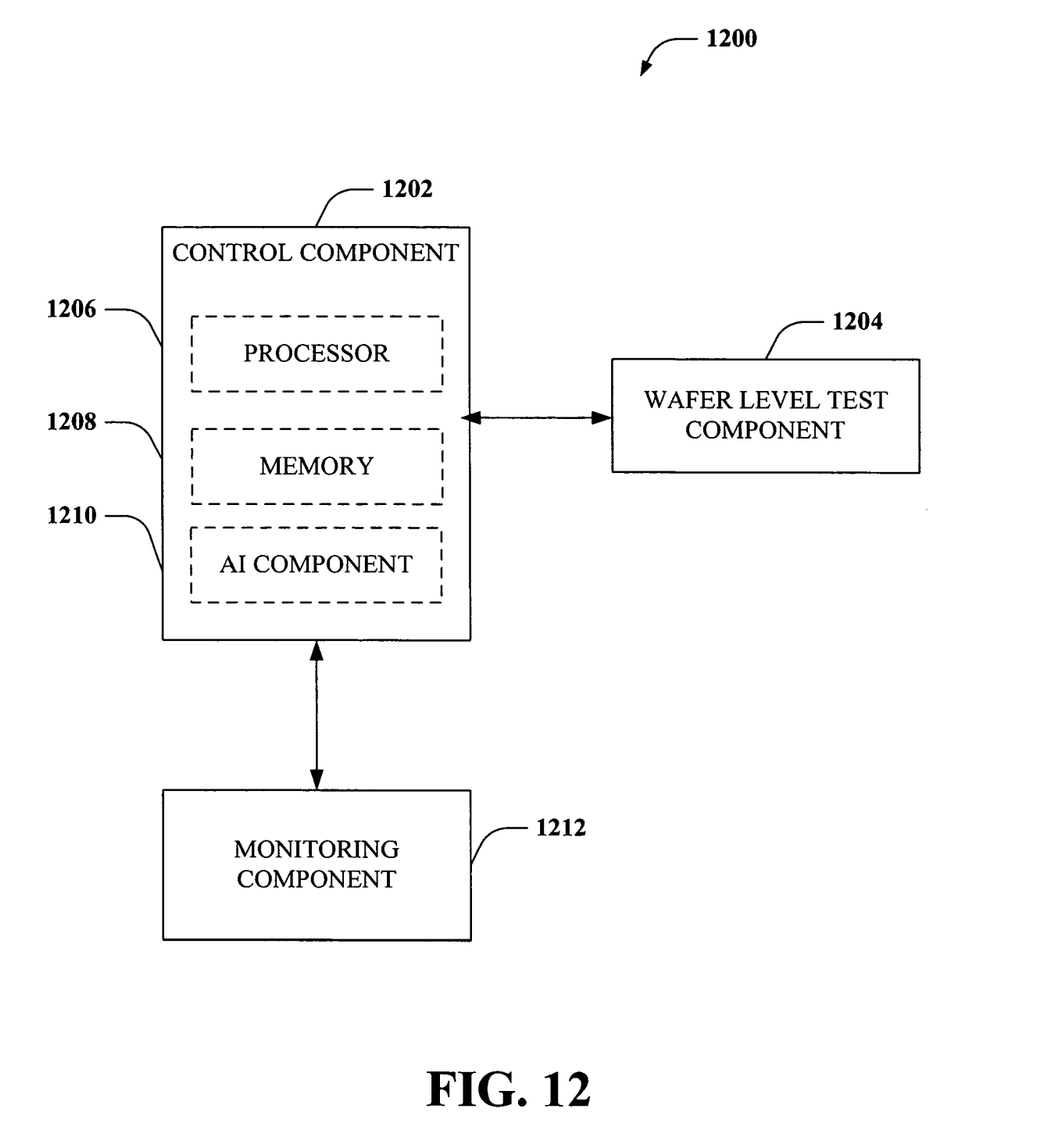
FIG. 12 illustrates a system 1200 that facilitates predicting reliability of production wafers when process variations in a wafer fabrication facility is mitigated, comprising a monitoring component in accordance with an aspect of the present invention.

FIG. 12 is an illustration of a wafer level reliability prediction system 1200 in accordance with yet another aspect of the invention, comprising a control component 1202 operatively coupled to a wafer level test component 1204. The control component 1202 comprises a processor 1206 that can analyze information received from components with which the control component 1202 is operatively associated. Additionally, the control component 1202 comprises a memory component 1208 that can store information associated with any of the functionalities of the wafer level reliability prediction system 1200, and an AI component 1210 that can make inferences to increase efficiency of the wafer level reliability prediction system 1200.

As illustrated in FIG. 12, a monitoring component 1212 is operatively coupled to the control component 1202. The monitoring component can be for example, any suitable wafer level metrology system that can monitor various parameters of test wafers in order to further facilitate the performance of the wafer level test components. Additionally, the monitoring component 1212 can be employed in situ in a wafer fabrication facility to measure extrinsic process variation(s). Such measurements can be received by the control component 1202 and analyzed in conjunction with intrinsic reliability information (e.g. gathered prior to a manufacturing phase, etc.) to predict reliability of production wafers while mitigating the need for a package-level reliability test, which is time-consuming and does not provide real-time feedback to the fabrication process regarding any parameter adjustments that may be required.

It is to be appreciated that the monitoring component 1212 can be, for example, a scatterometry component. The present invention contemplates any suitable scatterometry component and/or system, and such systems are intended to fall within the scope of the hereto-appended claims. It is further to be appreciated that the monitoring component 1212 utilized by the present invention can be, for example, a Scanning Electron Microscope (SEM), a Critical Dimension Scanning Electron Microscope (CD-SEM), a Field Emission Scanning Electron Microscope (FESEM), an In-Lens FESEM, or a Semi-In-Lens FESEM, depending on the desired magnification and precision. For example, FESEM permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically 0.5 kV to 30 kV), it is able to do so without inducing extensive electrical charge in the sample. Furthermore, conventional SEM cannot accurately image an insulating material unless the material is first coated with an electrically conductive material. FESEM mitigates the need to deposit an electrically conductive coating prior to scanning. According to another example, the monitoring component 1212 of the present invention can be In-Lens FESEM, which is capable of 0.5 nm resolution at an accelerating voltage of 30 kV, or any other suitable type of scanner, such as Transmission Electron Microscopy (TEM), Atomic Force Microscopy (AFM), Scanning Probe Microscopy (SPM), etc.

It is further to be appreciated that information gathered by the monitoring component 1212 can be utilized for generating feedback and/or feed-forward data that can facilitate wafer level reliability predictions. The wafer level reliability prediction system 1200 can additionally employ such data to control components and/or operating parameters associated therewith. For instance, feedback/feed-forward information can be generated from sequence analysis to control process variation and/or evaluate the potential impact of a reduced extrinsic component on overall wafer reliability. Additionally, one or a plurality of sensors can be associated with the wafer level reliability prediction system 1200 to permit data to be gathered regarding the state of the wafer (e.g., temperature, density, viscosity, material composition, and/or any other suitable information related to the condition of the wafer).

Figure 13:
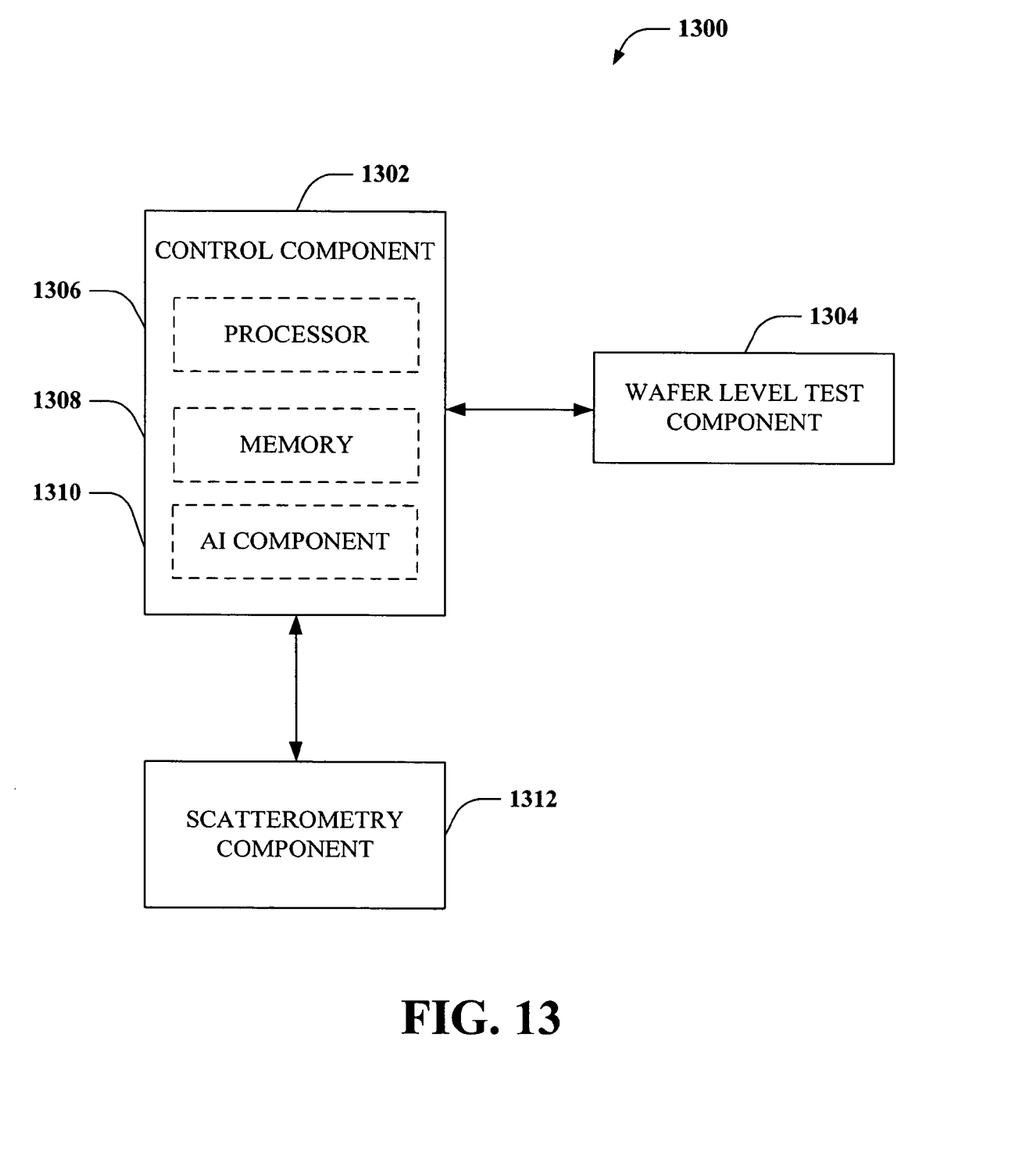
FIG. 13 illustrates a system 1300 that facilitates predicting reliability of production wafers when process variations in a wafer fabrication facility is mitigated, comprising a scatterometry system in accordance with an aspect of the present invention.

FIG. 13 is an illustration of a wafer level reliability prediction system 1300 in accordance with an aspect of the present invention. According to the figure, a control component 1302 is operatively coupled to a wafer level test component 1304. The control component 1302 comprises a processor 1306 that can analyze information received from components with which the control component 1302 is operatively associated. Additionally, the control component 1302 comprises a memory component 1308 that can store information associated with any of the functionalities of the wafer level reliability prediction system 1300, and an AI component 1310 that can make inferences to increase efficiency of the wafer level reliability prediction system 1300. As illustrated in FIG. 13 a scatterometry component 1312 is operatively coupled to the control component 1302. The scatterometry component 1312 is particularly well-adapted to monitor a wafer in conjunction with aspects of the present invention.

Scatterometry is a technique for extracting information about a surface upon which incident light has been directed. Information concerning properties including, but not limited to, dishing, erosion, profile, chemical composition, thickness of thin films and critical dimensions of features present on a surface such as a wafer can be extracted. Furthermore, information about an immersion medium such as refractive index and lithographic constant can be extracted by utilizing scatterometry techniques. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number, type of layers beneath the surface, refractive index of the surface, etc.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the immersion medium utilized in connection with a known grating structure on the surface. Such substantially unique phase/intensity signatures are produced by light reflected from and/or refracted by different surfaces and/or immersion mediums due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer or of an immersion medium can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals, to determine whether the signals correspond to a stored signature. The present invention contemplates any suitable scatterometry component and/or system, and such systems are intended to fall within the scope of the hereto-appended claims.

What has been described above comprises examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "comprises" is used in either the detailed description or the claims, such term is intended to be inclusive in a manner similar to the term "comprising" as "comprising" is interpreted when employed as a transitional word in a claim.

What is claimed is:

1. A system that facilitates predicting reliability of semiconductor devices, comprising:
a wafer level test component that performs an in line production test of a voltage ramp dielectric breakdown test on a wafer that determines a distribution of breakdown voltage and a median voltage breakdown of the wafer and generates at least one result indicative of line edge roughness (LER) based at least on the in line production test; and
a control component that quantifies the impact of the line edge roughness based at least in part on the result generated from the in line production test, wherein the control component mitigates effects of the line edge roughness by providing feedback to a fabrication facility producing the wafer if the LER of the wafer negatively impacts performance of the wafer.

2. The system of claim 1, the control component adjusts at least one test voltage to apply a stepped voltage to the wafer.

3. The system of claim 1, further comprising a monitoring component that gleans information regarding at least one physical parameter of the wafer.

4. The system of claim 3, the monitoring component is a scatterometry system.

5. The system of claim 1, the control component adjusts fabrication parameters.

6. The system of claim 1, further comprising an artificial intelligence component that makes inferences regarding predicting reliability when line edge roughness is mitigated.

7. A system that facilitates predicting reliability of production wafers, comprising:
means for testing a wafer having line edge roughness using a voltage ramp dielectric breakdown test that determines a distribution of breakdown voltage and a median voltage breakdown of the wafer;
means for quantifying line edge roughness in terms of electrical properties; and
means for mitigating the effects of the line edge roughness by providing feedback to a facility producing the wafer when the line edge roughness degrades device reliability.

8. The system of claim 7, further comprising a means for predicting wafer reliability.

9. The system of claim 8, further comprising a means to communicate to a fabrication facility.

* * * * *